United States Patent
Yang et al.

(10) Patent No.: US 8,252,682 B2
(45) Date of Patent: Aug. 28, 2012

(54) METHOD FOR THINNING A WAFER

(75) Inventors: Ku-Feng Yang, Dali (TW); Weng-Jin Wu, Hsinchu (TW); Hsin-Hsien Lu, Hsinchu (TW); Chia-Lin Yu, Sigang Township, Tainan County (TW); Chu-Sung Shih, Zhubei (TW); Fu-Chi Hsu, Taichung (TW); Shau-Lin Shue, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 298 days.

(21) Appl. No.: 12/704,695

(22) Filed: Feb. 12, 2010

(65) Prior Publication Data

US 2011/0198721 A1    Aug. 18, 2011

(51) Int. Cl.
*H01L 21/44* (2006.01)
*H01L 23/48* (2006.01)

(52) U.S. Cl. ........ 438/667; 438/455; 438/584; 438/692; 438/759; 257/506; 257/686; 257/751; 257/774; 257/797; 257/E21.23; 257/E21.237; 257/E21.597; 257/E23.011

(58) Field of Classification Search .................. 438/455, 438/584, 692, 759; 257/506, 686, 751, 774, 257/797, E21.23, E21.237, E21.597, E23.011
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |

(Continued)

*Primary Examiner* — Dao H Nguyen
(74) *Attorney, Agent, or Firm* — Lowe Hauptman Ham & Berner, LLP

(57) ABSTRACT

A method for thinning a wafer is provided. In one embodiment, a wafer is provided having a plurality of semiconductor chips, the wafer having a first side and a second side opposite the first side, wherein each of the chips includes a set of through silicon vias (TSVs), each of the TSVs substantially sealed by a liner layer and a barrier layer. A wafer carrier is provided for attaching to the second side of the wafer. The first side of the wafer is thinned and thereafer recessed to partially expose portions of the liner layers, barrier layers and the TSVs protruding from the wafer. An isolation layer is deposited over the first side of the wafer and the top portions of the liner layers, barrier layers and the TSVs. Thereafter, an insulation layer is deposited over the isolation layer. The insulation layer is then planarized to expose top portions of the TSVs. A dielectric layer is deposited over the planarized first side of the wafer. One or more electrical contacts are formed in the dielectric layer for electrical connection to the exposed one or more TSVs.

27 Claims, 4 Drawing Sheets

U.S. PATENT DOCUMENTS

| | | |
|---|---|---|
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,863,189 B2 * | 1/2011 | Basker et al. ............ 438/667 |
| 2010/0171197 A1 * | 7/2010 | Chang et al. ............ 257/621 |
| 2011/0095435 A1 * | 4/2011 | Volant et al. ............ 257/774 |
| 2011/0187000 A1 * | 8/2011 | West ....................... 257/751 |
| 2011/0291278 A1 * | 12/2011 | de Fresart et al. ....... 257/751 |

* cited by examiner

METHOD FOR THINNING A WAFER

TECHNICAL FIELD

The present disclosure relates generally to semiconductor wafer handling and processing, and more particularly to a method for thinning a wafer.

BACKGROUND

A semiconductor wafer generally includes a "front" side having integrated circuits formed thereon, and a "backside" comprising a thickness of semiconductor material, such as silicon. Also formed in the wafer may be through silicon vias (TSVs). A TSV is filled with a conductive material, such as copper or tungsten, and the TSV is then sealed by a barrier layer to prevent the copper, tungsten or other metal from diffusing into the substrate. Prior to the dicing and packaging of the individual integrated circuit chips, the backside of the wafer is typically thinned to remove unwanted semiconductor material to allow for smaller packaging.

The thinning process is typically performed on the backside of the wafer by mechanical grinding and then chemical mechanical polishing (CMP). The CMP is continued until the thickness of the bulk silicon reaches a desired amount. Once this desired thickness is reached, the TSV is usually exposed. However, the exposed TSV typically diffuses copper or metallic contamination into the substrate, thereby deteriorating the overall performance of devices formed in the wafer and causing device failure.

For this reason and other reasons that will become apparent upon reading the following detailed description, there is a need for an improved wafer thinning process that does not expose copper or other metallic contaminants from the TSV into the substrate.

SUMMARY

The present disclosure is directed to a method for thinning a wafer. In one embodiment, a wafer is provided having a plurality of semiconductor chips, the wafer having a first side and a second side opposite the first side, wherein each of the chips includes a set of through silicon vias (TSVs), each of the TSVs substantially sealed by a liner layer and a barrier layer. A wafer carrier is provided for attaching to the second side of the wafer. The first side of the wafer is thinned and thereafter recessed to partially expose portions of the liner layers, barrier layers, and the TSVs protruding from the wafer. An isolation layer is deposited over the first side of the wafer and the top portions of the liner layers, barrier layers, and the TSVs. Thereafter, an insulation layer is deposited over the isolation layer. The insulation layer is then planarized to expose top portions of the TSVs. A dielectric layer is deposited over the planarized first side of the wafer. One or more electrical contacts are formed in the dielectric layer for electrical connection to the exposed one or more TSVs.

Another aspect of the present invention is to provide a thinned semiconductor device. In one embodiment, the semiconductor device comprises a semiconductor wafer having a plurality of semiconductor chips, each of the plurality of chips having a set of device structures embedded therein, wherein each of the device structures have a planarized, partially exposed top portion. Liner layers substantially seal the sides of the device structures and barrier layers substantially seal the sides of the liner layers. Isolation layers are formed on the sides of a top portion of the barrier layers, wherein the isolation layers are formed between any two of the device structures. Insulation layers are formed above the isolation layers, the insulation layers planarized with the planarized top portions of the device structures. A dielectric layer is formed above the planarized insulation layer and the planarized top portions of the device structures. A plurality of redistribution layers (RDLs) are embedded within the dielectric layer, the RDLs coupled to the planarized, exposed top portions of the device structures.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present invention. However, one having an ordinary skill in the art will recognize that embodiments of the invention can be practiced without these specific details. In some instances, well-known structures and processes have not been described in detail to avoid unnecessarily obscuring embodiments of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
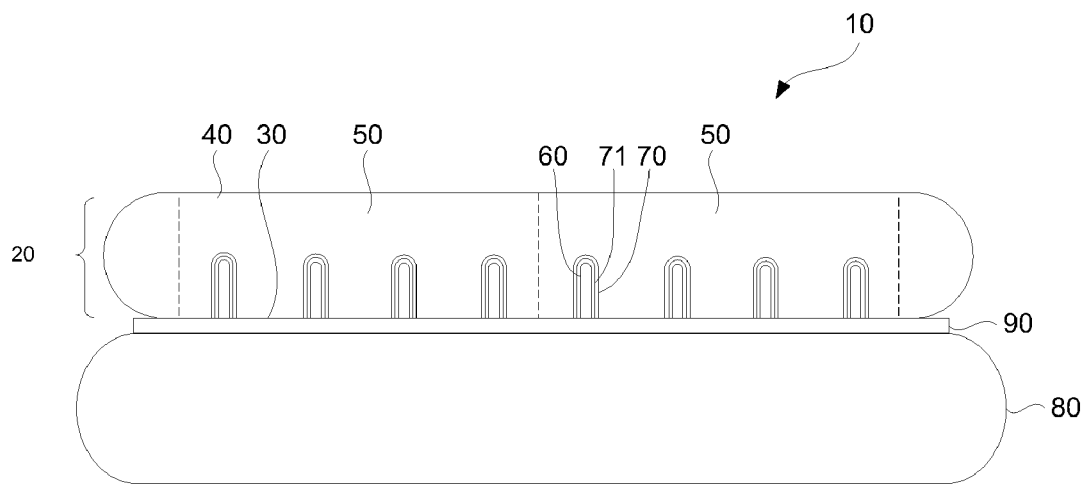
FIGS. 1-7 are cross-sectional views of a semiconductor device undergoing a wafer thinning process according to one embodiment of the present invention.

FIGS. 1-7 are cross-sectional views of a semiconductor device undergoing a wafer thinning process according to one embodiment of the present invention. FIG. 1 shows a cross-sectional view of an integrated circuit structure 10 having a wafer 20, the wafer 20 having a plurality of semiconductor chips 50. Wafer 20 may comprise bulk silicon, doped or undoped, gallium arsenide, sapphire, glass, silicon-on-insulator (SOI) substrate, or the like. Wafer 20 has a front side 30 and a back side 40 opposite the front side 30, wherein bond pads (not shown) and/or other interconnect structures (not shown) are close to the front side 30, while one or more device structures 60 are formed in wafer 20. In one embodiment, the device structures 60 comprise through silicon vias (TSVs) that extend from the front side 30 toward the back side 40. In another embodiment, the device structures 60 are trenches. In yet another embodiment, the device structures 60 are alignment marks. Integrated circuits (not shown) including active and passive devices such as transistors, resistors, capacitors, diodes, fuses, dielectric layers, metal layers, and the like, are formed at the front side 30 of wafer 20. These integrated circuits perform one or more functions and these functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

According to one embodiment, one or more TSVs 60 are formed in the individual chips 50 of wafer 20. The TSVs 60 may be formed using any known and reliable process of TSV formation. FIG. 1 shows four TSVs 60 formed per chip 50. It is understood that any number of TSVs 60 may be formed in wafer 20. It is also understood that the TSVs 60 may be formed into a pattern having varying, known specific depths. In some embodiments, the TSVs 60 are formed to have a high depth-to-width ratio. For example, the Bosch etching process employs a deep reactive ion etching that uses two different gas types in the reactor, which can achieve etching ratios of up to around 50:1. The TSVs 60 may be formed of any suitable conductive material. In one embodiment, the TSVs 60 are formed of a highly-conductive, low-resistive metal, elemental metal, transition metal, or the like. In one exemplary embodiment, the TSVs 60 are filled with copper (Cu), tungsten (W), or the like.

A dielectric liner layer 71 may be deposited over the TSVs 60. Liner layer 71 provides adhesion for a later-deposited barrier layer to each of the TSVs 60. In one embodiment, the liner layer 71 comprises an oxide material and may be formed by chemical vapor deposition (CVD) or spin on glass (SOG), although other techniques could alternatively be used. The liner layer 71 formed on each TSV 60 may have a thickness in the range of from about 1,000 Angstroms to about 2,000 Angstroms, according to one embodiment. It is understood by those skilled in the art, however that the thickness of the liner layer 71 will depend on the TSV 60 dimensions as well on the amount of adhesion needed between each TSV 60 and a later-deposited barrier layer.

Each of the TSVs 60 may be substantially sealed by a barrier layer 70 to prevent copper or other metal in the TSV from diffusing into the substrate, where it might deteriorate the overall performance of other devices formed on wafer 20. In one embodiment, the barrier layer 70 is formed over the liner layer 71 and may comprise one or more layers of titanium, titanium nitride, tantalum, tantalum nitride, or the like. The barrier layer 70 may be formed through chemical vapor deposition or physical vapor deposition (PVD), although other techniques could alternatively be used. The barrier layer 70 may have a thickness in the range of from about 50 Angstroms to about 500 Angstroms.

Also shown in FIG. 1 is a wafer carrier 80 attached to the front side 30 of wafer 20 by an adhesive layer 90, according to one embodiment. Wafer carrier 80 acts as a temporary support substrate or carrier to facilitate wafer handling, transport, and processing. Wafer carrier 80 can be a silicon substrate, glass substrate, polymer substrate, polymer-based composite substrate, or thick tape and may be attached to the front side 30 of wafer 20 by, for example adhesive bonding, tape bonding, or resin bonding. Wafer carrier 80 is preferably rigid as a rigid carrier helps to reduce wafer warping and prevents wafer breakage during handling and processing.

Figure 2:
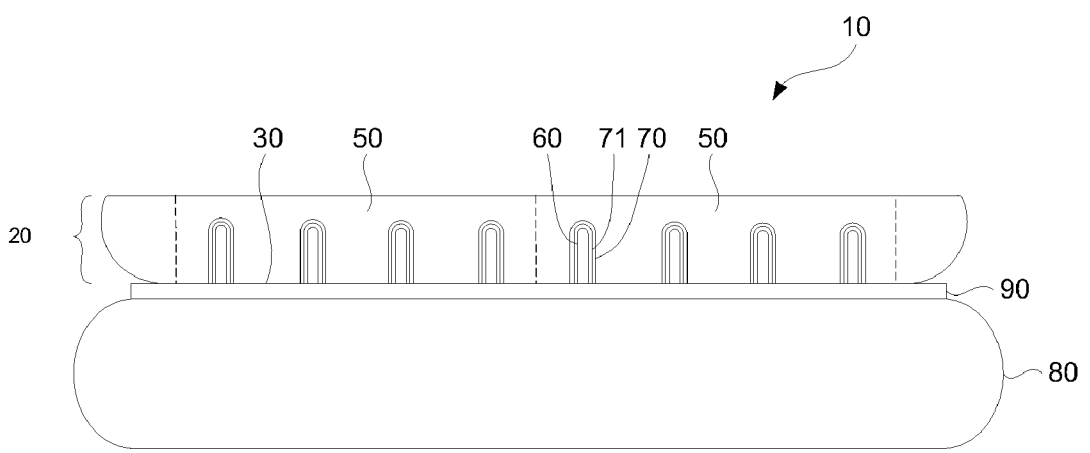

Having attached the wafer 20 to the wafer carrier 80, the wafer 20 is now ready for backside grinding. As shown in FIG. 2, the non-chip side or the back side 40 of wafer 20 is mechanically ground by a grinder, a chemical mechanical polish (CMP), or some other suitable removal process to reduce the thickness thereof. With mechanical grinding, wafer 20 can be ground to a thickness of about 25 μm to about 100 μm, depending on conditions. However, further reduction in the thickness of wafer 20 by mechanical grinding may result in damage to the wafer. Therefore, to further reduce the thickness of wafer 20, it is preferable to use a method less likely to cause damage during this process such as, for example wet chemical etching, dry chemical etching, dry polishing, or plasma etching.

Figure 3:
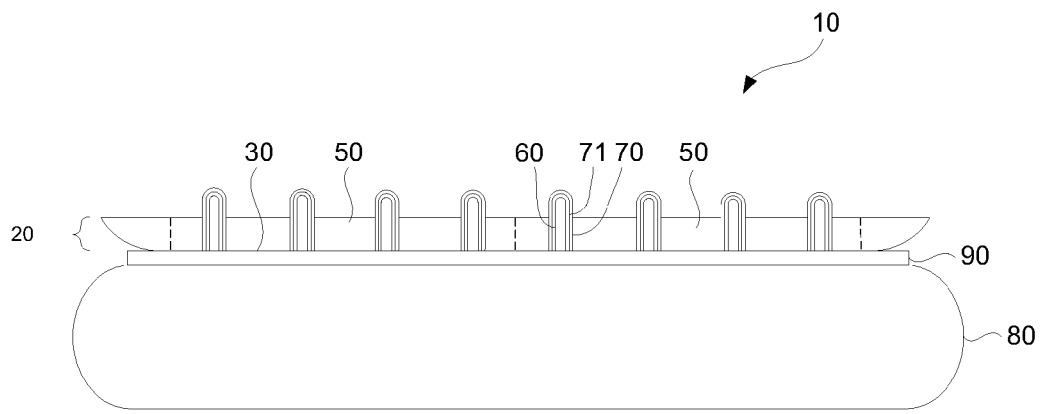

The thinning process progresses on wafer 20 to a desired thickness to expose the TSVs 60. FIG. 3 shows top portions of the dielectric liner layers 71, barrier layers 70 and the TSVs 60 partially protruding from the wafer 20. The thickness of wafer 20 can be set depending on the purpose for which the chip package is to be used. In one embodiment, the wafer 20 is thinned to a thickness of from about 25 μm to about 100 μm. In another embodiment, the wafer 20 is thinned to a thickness of from about 25 μm to about 50 μm.

Figure 4:
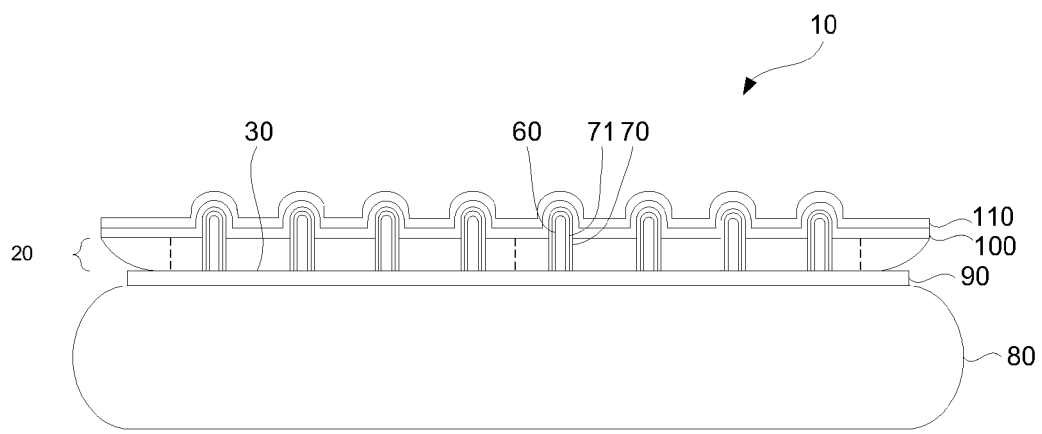

According to an aspect of the present invention, an isolation layer 100 is thereafter deposited over wafer 20 and over the top portions of the barrier layers 70, liner layers 71 and the TSVs 60. The isolation layer 100 serves to prevent the copper, tungsten or other metal ions in the TSVs 60 from diffusing into an active region of wafer 20 in a subsequent processing step that exposes the TSVs 60. Although FIG. 4 shows isolation layer 100 as a single layer, isolation layer 100 may comprise a plurality of layers and/or different materials. The isolation layer 100 may comprise silicon nitride, silicon oxynitride, silicon oxide, silicon dioxide, tantalum nitride (TaN), titanium nitride (TiN), carbides, SOG, BCB, tetraethylorthosilicate (TEOS), polyimide, polymers, or any other silicon-related material suitable to prevent the diffusion of copper or other metal from TSVs 60 into the substrate. Isolation layer 100 may be formed using a conventional deposition process such as, for example chemical vapor deposition (CVD), low pressure chemical vapor deposition (LPCVD), plasma enhanced chemical vapor deposition (PECVD), physical vapor deposition (PVD), spin-on coating, or other suitable processes. The dimensions (e.g., thickness and height) of the isolation layer depend on chip design criteria and functionality. In one embodiment of the present invention, the isolation layer 100 has a thickness of from about 100 Angstroms to about 1,000 Angstroms. In some embodiments, the isolation layer 100 has a thickness of from about 200 Angstroms to about 500 Angstroms.

Still referring to FIG. 4, an insulation layer 110 is formed over the isolation layer 100, in order to seal and protect the isolation layer 100 and reduce stress on wafer 20 during a subsequent thinning process. The insulation layer 110 may comprise a single layer or a plurality of layers and comprise a dielectric material, such as oxides or silicon nitride, although other suitable dielectrics, such as a high-k dielectric or polyimide, may alternatively be used. The insulation layer 110 may be formed using a conventional deposition process such as CVD, PECVD, or spin-on, although other suitable processes may alternatively be used. In one embodiment, the insulation layer 110 has a thickness of from about 2,000 Angstroms to about 20,000 Angstroms. In some embodiments, the insulation layer 110 has a thickness of from about 3,000 Angstroms to about 10,000 Angstroms.

Figure 5:
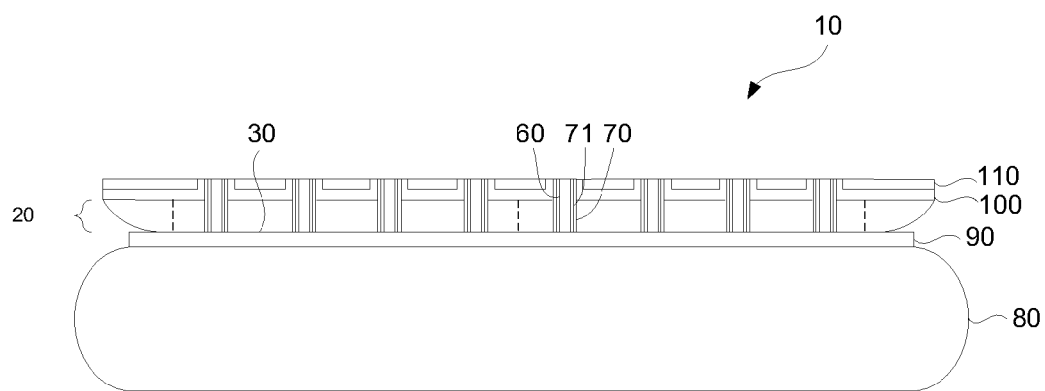

FIG. 5 shows a top surface of wafer 20 that has been planarized and exposes top portions of the TSVs 60 for further electrical connection. In one embodiment, a chemical mechanical polishing (CMP) process may be performed on wafer 20 to planarize the insulation layer 110. In another embodiment, the insulation layer 110 may be planarized by first depositing a photoresist layer (not shown) thereover and then etching back the photoresist layer using an appropriate etch back process. The exposed TSVs 60 provide electrical connection to contact points, such as metal interconnects, redistribution layers (RDL), or the like, or to semiconductor structures such as transistors, capacitors, resistors, or the like.

Figure 6:
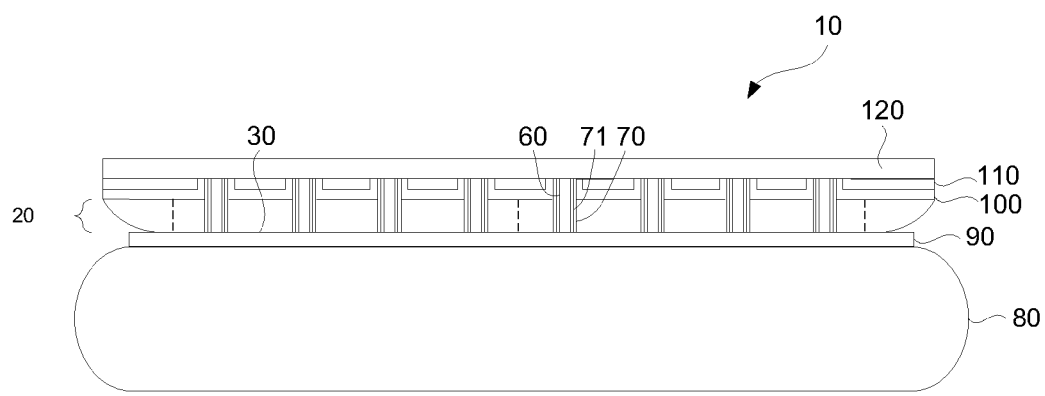
Figure 7:
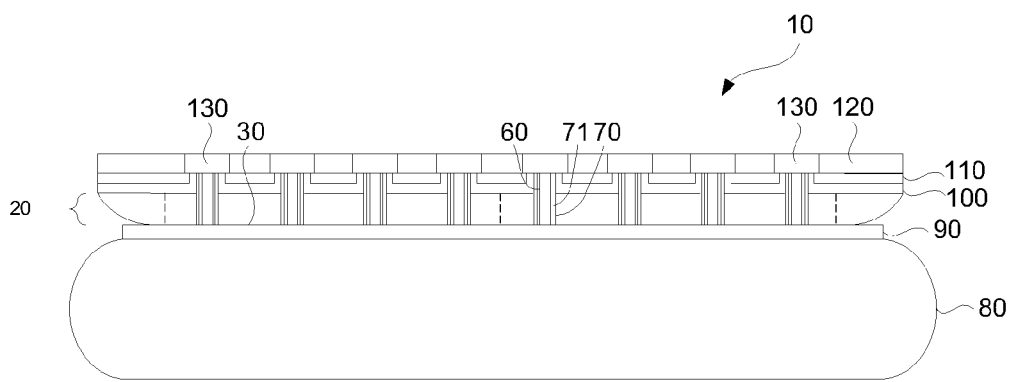

Following the planarization of wafer 20, a planar dielectric layer 120 is formed over the thinned side of wafer 20 as shown in FIG. 6. Metal lines/pads (not shown) and RDLs are formed in dielectric layer 120, and are electrically connected to TSVs 60. Generally, dielectric layer 120 may comprise one or more layers and may be formed, for example, of a low-K dielectric material, silicon oxide, phosphosilicate glass (PSG), borophosphosilicate glass (BPSG), fluorinated silicate glass (FSG), polyimide, nitride, or the like. In an embodiment, the one or more dielectric layers 120 comprise an oxide that may be formed by chemical vapor deposition (CVD) techniques using tetra-ethyl-ortho-silicate (TEOS) and oxygen as a precursor. Other materials and processes may be used. Shown in FIG. 7 are RDLs 130 connected to respective exposed ends of the TSVs 60. RDLs 130 may be formed in the dielectric layer 120 by any suitable process, including photolithography, etching and damascene techniques. Generally, photolithography techniques involve depositing a photoresist material, which is masked, exposed, and developed to expose portions of the dielectric layer that are to be removed. In a damascene process, the resulting structures formed by the removed portions are then filled with a conductive metal such as copper to form RDLs 130. It should be understood that in the embodiment illustrated in FIG. 7, the RDLs 130 formed in wafer 20 may connect to any type of semiconductor structure (not shown), such as transistors, capacitors, resistors, and the like, or an intermediate contact point, such as a metal interconnect, metal pad, or the like. Typically, after wafer-level testing has been completed, wafer 20 is then affixed to a dicing tape or a die frame where it is then diced in the usual manner along cutting lines to separate the wafer into individual semiconductor packages.

Exemplary embodiments of the preceding disclosure for thinning a wafer have been described that yield high wafer throughput compared to conventional methods. It will be evident, however that various modifications, structures, processes, and changes may be made thereto without departing from the broader spirit and scope of the embodiments of the present invention, as set forth in the claims. The specification and drawings are, accordingly, to be regarded as illustrative and not restrictive. It is understood that embodiments of the present invention are capable of using various other combinations and environments and are capable of changes or modifications within the scope of the inventive concept as expressed herein.

What is claimed is:

1. A method for thinning a wafer, comprising:
   providing a wafer having a plurality of semiconductor chips, the wafer having a first side and a second side opposite the first side, wherein each of the chips includes a set of device structures, each of the device structures being substantially sealed by a liner layer and a barrier layer;
   providing a wafer carrier, wherein the wafer carrier is attached to the second side of the wafer;
   thinning the first side of the wafer to a predetermined thickness;
   recessing the first side of the wafer to partially expose top portions of the liner layer, barrier layer, and the device structures;
   depositing an isolation layer over the first side of the wafer and the top portions of the liner layer, barrier layer, and the device structures;
   depositing an insulation layer over the isolation layer;
   planarizing the insulation layer to expose top portions of the device structures for electrical connection; and
   depositing a dielectric layer over the planarized first side of the wafer.

2. The method of claim 1, wherein the set of device structures comprises one or more of a through silicon via (TSV), a trench, or an alignment mark.

3. The method of claim 1, wherein the liner layer is formed by chemical vapor deposition (CVD) or spin-on glass (SOG), and wherein further the liner layer has a thickness range of from about 1,000 Angstroms to about 2,000 Angstroms.

4. The method of claim 1, wherein the barrier layer comprises tantalum (Ta), Ta/TaN, titanium (Ti), or Ti/Ti, and has a thickness range of from about 50 Angstroms to about 500 Angstroms.

5. The method of claim 1, wherein the wafer carrier is attached to the second side of the wafer by a method selected from the group consisting of adhesive bonding, adhesive tape, tape bonding, and resin bonding.

6. The method of claim 1, wherein thinning the wafer comprises mechanically thinning the wafer using grinding or chemical mechanical polish (CMP).

7. The method of claim 1, wherein the step of recessing comprises wet etching, dry etching, dry polishing, or plasma etching.

8. The method of claim 1, wherein the isolation layer has a thickness range of from about 100 Angstroms to about 1,000 Angstroms.

9. The method of claim 1, wherein the isolation layer is formed by chemical vapor deposition (CVD), low pressure chemical vapor deposition (LPCVD), plasma-enhanced chemical vapor deposition (PECVD), physical vapor deposition (PVD), or spin-on coating.

10. The method of claim 1, wherein the isolation layer comprises $SiN_x$, $SiON_x$, $SiO_x$, TaN, TiN, carbides, SOG, BCB, polyimide, TEOS, or polymers.

11. The method of claim 1, wherein the insulation layer has a thickness of from about 2,000 Angstroms to about 20,000 Angstroms and comprises an oxide, a high-k dielectric material, or polyimide.

12. The method of claim 1, further comprising forming redistribution layer (RDLs) in the dielectric layer, the RDLs for electrically coupling to the exposed device structures.

13. A method for thinning a wafer, comprising:
   providing a wafer having a plurality of semiconductor chips, the wafer having a first side and a second side opposite the first side, wherein each of the chips includes a set of through silicon vias (TSVs), each of the TSVs being substantially sealed by a liner layer and a barrier layer;
   providing a wafer carrier, wherein the wafer carrier is attached to the second side of the wafer;
   thinning the first side of the wafer to a predetermined thickness;
   recessing the first side of the wafer to partially expose portions of the liner layer, barrier layer, and the TSVs, the liner layers, the barrier layers and the TSVs protruding from the wafer;
   depositing an isolation layer over the first side of the wafer and the top portions of the liner layer, barrier layer, and the TSVs;
   depositing an insulation layer over the isolation layer;
   planarizing the insulation layer to expose top portions of the TSVs;
   depositing a dielectric layer over the planarized first side of the wafer; and
   forming one or more electrical contacts for electrical connection to the exposed one or more TSVs.

14. The method of claim 13, wherein the barrier layer comprises tantalum (Ta), Ta/TaN, titanium (Ti), or Ti/Ti.

15. The method of claim 13, wherein the wafer carrier comprises a silicon substrate, glass substrate, polymer substrate, polymer-based composite substrate, or thick tape and the wafer carrier is attached to the second side of the wafer by a method selected from the group consisting of adhesive bonding, adhesive tape, tape bonding, and resin bonding.

16. The method of claim 13, wherein thinning the wafer is performed at least in part by grinding or chemical mechanical polish (CMP), and the step of recessing comprises wet etching, dry etching, or plasma etching.

17. The method of claim 13, wherein the isolation layer has a thickness range of from about 100 Angstroms to about 1,000 Angstroms and is formed by chemical vapor deposition (CVD), low pressure chemical vapor deposition (LPCVD), plasma-enhanced chemical vapor deposition (PECVD), physical vapor deposition (PVD), or spin-on coating.

18. The method of claim 13, wherein the isolation layer comprises $SiN_x$, $SiON_x$, $SiO_x$, TaN, TiN, carbides, SOG, BCB, polyimide, TEOS, or polymers.

19. The method of claim 13, wherein the insulation layer has a thickness of from about 2,000 Angstroms to about 20,000 Angstroms and comprises an oxide, a high-k dielectric material, or polyimide.

20. The method of claim 13, wherein the one or more electrical contacts comprise a redistribution layer (RDL) or metal contact.

21. A method for thinning a wafer having a plurality of semiconductor chips therein, the method comprising:
    forming a set of through silicon vias (TSVs) in each of the plurality of semiconductor chips;
    depositing a dielectric liner layer over the set of TSVs;
    forming a barrier layer over the dielectric liner layer;
    thinning the wafer to expose top portions of at least one of the liner layer, barrier layer, or the device structures;
    depositing an isolation layer over the exposed top portions of the at least one of the liner layer, barrier layer, or the device structures;
    depositing an insulation layer over the isolation layer;
    planarizing the insulation layer to expose the device structures;
    depositing a dielectric layer over the planarized insulation layer; and
    forming at least one redistribution layer in the dielectric layer.

22. The method of claim 21, wherein the thinning the wafer comprises at least one of mechanical grinding or etching.

23. The method of claim 21, wherein the depositing the dielectric liner over the set of TSVs comprises depositing an oxide material using chemical vapor deposition (CVD) or spin on glass (SOG).

24. The method of claim 21, wherein the forming the barrier layer using CVD or physical vapor deposition (PVD).

25. The method of claim 21, wherein the planarizing the insulation layer comprises chemical mechanical polishing (CMP) or etching.

26. The method of claim 21, wherein the depositing the dielectric layer comprises CVD using tetra-ehtyl-ortho-silicate (TEOS) and oxygen.

27. The method of claim 21, wherein the forming the at least one redistribution layer comprises using damascene techniques.

* * * * *